US006430733B1

(12) United States Patent
Cohn et al.

(10) Patent No.: US 6,430,733 B1
(45) Date of Patent: Aug. 6, 2002

(54) CONTEXTUAL BASED GROUNDRULE COMPENSATION METHOD OF MASK DATA SET GENERATION

(75) Inventors: John M. Cohn, Richmond; Daniel C. Cole, Jericho, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/296,369

(22) Filed: Apr. 22, 1999

(51) Int. Cl.[7] ................................................ G06F 17/50
(52) U.S. Cl. ................................ 716/11; 716/2; 716/19
(58) Field of Search ............................. 716/19, 20, 21, 716/1, 2, 4, 7, 8, 9, 10, 11

(56) References Cited

U.S. PATENT DOCUMENTS

| 5,432,714 A | * | 7/1995 | Chung et al. ............... 364/525 |
| 5,553,273 A | | 9/1996 | Liebmann |
| 5,553,274 A | | 9/1996 | Liebmann |
| 5,657,235 A | | 8/1997 | Liebmann et al. |
| 5,663,893 A | | 9/1997 | Wampler et al. |
| 5,682,323 A | | 10/1997 | Pasch et al. |
| 5,707,765 A | | 1/1998 | Chen |
| 5,723,233 A | | 3/1998 | Garza et al. |
| 5,801,954 A | | 9/1998 | Le at al. |
| 6,249,902 B1 | * | 6/2001 | Igusa et al. ................... 716/10 |

* cited by examiner

Primary Examiner—Matthew Smith
Assistant Examiner—Leigh Marie Garbowski
(74) Attorney, Agent, or Firm—McGinn & Gibb, PLLC; Richard M. Kotulak, Esq.

(57) ABSTRACT

A structure and method of designing an integrated circuit includes generating at least one device shape, altering the device shape to comply with predetermined rules, forming a first hierarchical level abstraction around the device shape (where the first hierarchical level abstraction represents a perimeter of the device shape), preparing a first hierarchical level arrangement of first hierarchical level abstractions, altering the first hierarchical level arrangement to comply with the predetermined rules, forming a second hierarchical level abstraction around the first hierarchical level arrangement (where the second hierarchical level abstraction represents a perimeter of the first hierarchical level arrangement), preparing a second hierarchical level arrangement of second hierarchical level abstractions, and altering the second hierarchical level arrangement to comply with the predetermined rules.

20 Claims, 4 Drawing Sheets

CONTEXTUAL BASED GROUNDRULE COMPENSATION METHOD OF MASK DATA SET GENERATION

BACKGROUND OF THE INVENTION

1. Field of the Invention

The present invention generally relates to the design of integrated circuit structures and more specifically to an improved method for checking integrated circuit designs against various parameters.

2. Description of the Related Art

As the minimum feature size in semiconductor integrated circuit (IC) technology is pushed near or below the wavelength of the light used in microlithographic projection printing, diffraction effects introduce significant differences between the patterns used on microlithographic reticles and the resulting printed structures on a semiconductor wafer. Similarly, the smaller the circuit elements become, the more difficult it is to create the desired pattern shapes on the wafer due to factors such as localized etch variations, mask distortions, lens distortions, topography variations, and non-uniform material composition. These dimensional variations can cause unacceptable deviations in device and interconnect characteristics, which in turn can degrade circuit performance and accuracy. The magnitude of this problem increases as critical circuit dimensions decrease.

A principle cause of these dimensional variations in a given structure is the degree of proximity to nearby shapes. Conventional solutions address this problem by changing (e.g., compensating) the dimensions of shapes in the mask design. However, in conventional practice, these corrections are performed after the entire design is completed. At this point in the design, there may not be sufficient flexibility to make all desirable compensations. As described in detail below, with the invention the compensations are made earlier in the design process, thereby greatly improving the overall circuit design and performance.

SUMMARY OF THE INVENTION

It is, therefore, an object of the present invention to provide a structure and method of designing an integrated circuit that includes generating at least one device shape, altering the device shape to comply with predetermined rules, forming a first hierarchical level abstraction around the device shape (where the first hierarchical level abstraction represents a perimeter of the device shape), preparing a first hierarchical level arrangement of first hierarchical level abstractions, altering the first hierarchical level arrangement to comply with the predetermined rules, forming a second hierarchical level abstraction around the first hierarchical level arrangement (where the second hierarchical level abstraction represents a perimeter of the first hierarchical level arrangement), preparing a second hierarchical level arrangement of second hierarchical level abstractions, and altering the second hierarchical level arrangement to comply with the predetermined rules.

The altering of the first hierarchical level includes comparing the first hierarchical abstractions with each other for consistency with the predetermined rules and the altering of the second hierarchical level includes comparing the second hierarchical abstractions with each other for consistency with the predetermined rules.

The method also includes, for each successive hierarchical level, forming a next hierarchical level abstraction around a previous hierarchical level arrangement, the next hierarchical level abstraction representing a perimeter of the previous hierarchical level arrangement, preparing a next hierarchical level arrangement of a plurality of next hierarchical level abstractions, and altering the next hierarchical level arrangement to comply with the predetermined rules.

The predetermined rules include spacing requirements, uniform element formation requirements, uniform material thickness requirements, width, alignment, step, coverage, minimum necking, etc. The altering of the device shape includes making shape corrections to nullify anticipated manufacturing effects.

The invention reduces across chip line variation (ACLV) that arises from proximity process effects which cause variations in printing for nested or isolated structures in microchip fabrication. The invention is particularly useful for logic parts that include many different local circuit blocks. The invention takes available models for predicting the printability of microchip circuit features and directly incorporates them within a microchip circuit design methodology to produce overall improved circuit performance.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
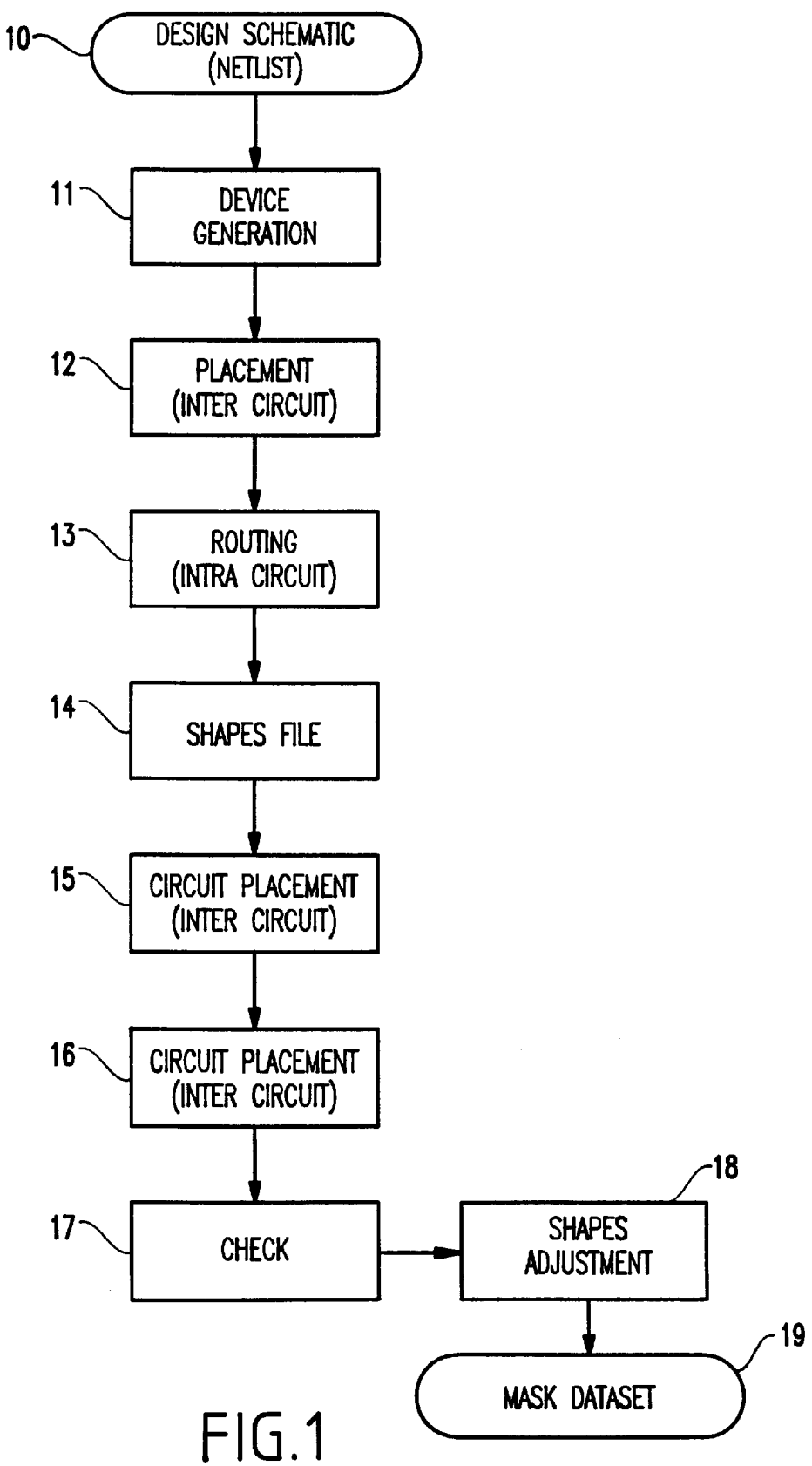
FIG. 1 is a flow diagram of an embodiment of the invention.

In the art of integrated circuit design, and more particularly in the art of photolithographic integrated circuit design, methods exist to alter design shapes to compensate for predicted production effects, such as defects in masks (e.g., a shapes proximity correction algorithm). Typically, the computations used to make such design shape predictions are both memory and time intensive, and the complexity increases dramatically with the number of shapes involved.

During integrated circuit design, an effect known as the proximity effect occurs. More specifically, the proximity effect includes a number of distortions and changes which occur as devices are placed closer and closer (e.g., in closer proximity) to one another in the circuit design.

The invention exploits the fact that many of these proximity effects act over a relatively short distance. This allows the invention to limit the analysis to a small (e.g., 5 μm) fixed aperture. There are also much longer range (e.g. non-proximity) effects that exist, such as microloading etching effects. An example of a microloading etching is etch rate variations due to variations in local shape density during CMP (chemical-mechanical polishing).

However, these long range effects can be addressed separately by, for example, adding fill shapes to result in uniform densities in layouts on the longer range scale. The present invention targets the generally more difficult and critically important short range correction effects (e.g., proximity effects).

Nearly all microchips are constructed hierarchically from components of increasing size and complexity. As discussed in greater detail below, the invention generates shape compensations for the components in a "bottoms up" procedure from individual devices up through the full chip. Thus, the invention maximizes the flexibility by allowing many options as early on as possible. The invention also drastically reduces the computational cost of making detailed shape compensation calculations at the full chip level.

More specifically, the invention exploits observation at the smallest level (i.e., device level) to do local calculations, and propagates these corrections up through the full levels of hierarchy. For example, local corrections (e.g., a shapes proximity correction algorithm which compensates for predicted mask: defects and other manufacturing effects) could be used while designing sets of devices to form a simple circuit.

Preferably, these corrections begin by adjusting all of these shapes within the interior of the simple circuit. After the simple circuit corrections, the shapes within the center of the simple circuit will no longer contribute to the corrections required at the next level of design. Instead, a much simpler abstraction of the entire simple circuit (e.g., one based on the shape of the periphery of the simple circuit) is used to make the proximity corrections at the next level of design (e.g., at a macro level). Similar calculations are preformed for the next level, yielding the next level of abstractions.

Each of these levels of abstractions greatly reduces the amount of data volume and computational complexity required. In an environment where circuit libraries are reused (i.e., an application specific integrated circuit "ASIC" library), this methodology will allow the cost of analysis to be amortized over all users of each individual design element.

The invention provides several advantages over conventional practices, which wait until the logic circuit is fully constructed to run a shapes proximity correction algorithm. However, when the corrections are inserted after the logic circuit is fully constructed, the layout is set and only individual shapes can be altered, such as by adding serifs or subresolution elements. Serifs and subresolution elements are small features used to compensate for the "pre-distorted" mask image. The inherent distortion in the lithography process known as "sub-resolution" occurs when structures are too small to be produce reliably as discreet lithographic shapes. Sub-resolution elements are used to soften hard corners to increase lithographic process reliability.

Therefore, the conventional processes does not offer the designer the full range of flexibility and opportunity for circuit layout improvements that the present invention does. Moreover, the inventive hierarchical design proximity correction greatly reduce the computational burden (CPU and memory) of making these corrections, as compared to conventional systems.

Referring now to the drawings, the flowchart in FIG. 1 illustrates a first embodiment of the invention. The process shown in FIG. 1 first generates circuit layouts and then generates chip layouts. In item 10, a design schematic (e.g., a netlist) is supplied by the designer. The design schematic can be converted into a mask data set using, for example, Graphics Language 1 (GL/1) or Graphics Data Set (GDS2). The mask data sets will be used to drive the tools that write the masks. For example, alterations to compensate for anticipated manufacturing variations are preferably made at each hierarchical level of the design process.

Figure 2A:
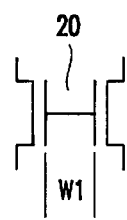
FIGS. 2A–2C are schematic diagrams of integrated circuit structures formed according to the invention.
Figure 2B:
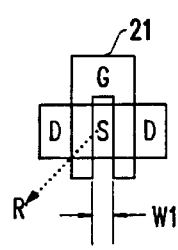

In item 11, individual devices are generated from the schematic 10 by referring to a standard library according to prescribed groundrules. For example, as shown in FIG. 2A, a schematic of a transistor 20 from the device schematic is used to produce the shape 21 (e.g., a patterned transistor), shown in FIG. 2B which includes a source "S", gate "G" and drain "D" regions. A library of shapes for transistors is preferably referenced (given the schematic 20, which is manually or algorithmically generated) and an appropriate patterned shape 21 is retrieved from the library.

The patterned shape 21 is checked against groundrules to determine whether it is acceptable to the designer's requirements. For example, the space W1 is checked to see if it is within the acceptable tolerances and the shape 21 is adjusted if necessary. This is done for all device elements at this hierarchical level. Thus, circuitry proximity corrections in the form of serifs or subresolution elements could be introduced here to improve printability and to allow the greatest flexibility to the designer.

While the groundrules mentioned in this application check proper spacing between parts of an element and between adjacent elements, as would be known by one ordinarily skilled in the art given this disclosure, the groundrules can also check for uniformity of completeness of formation of features, uniformity of materials thicknesses, width, alignment, step, coverage, minimum necking, etc.

Figure 2C:
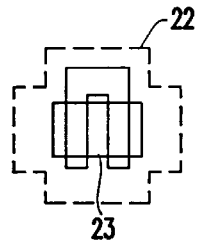

In FIG. 2C, an abstraction 22 of the shape 21 is created to define the perimeter of the shape 21. The abstraction 22 is a shape that conforms to the major features on the perimeter of the shape. The distance (if any) that, the abstraction 22 extends beyond the perimeter of the shape would be determined by the technology spacing rules. The spacing (e.g., 5 $\mu$m) limitation is only concerned with features that are located within a predetermined distance (e.g., 5 $\mu$m) into abstraction. The analysis preferably only considers these features because as discussed above, only the proximity effects are of concern, as longer range effects will be compensated using conventional systems. Thus, if a feature is beyond the predetermined distance (e.g., 5 $\mu$m) into the interior of the abstraction, that feature can be ignored for the proximity effect analysis thus greatly simplifying the process.

An important feature of the invention is that, once the abstraction 22 is created, there is no need to perform any additional corrections within the abstraction 22 because the shape 21 within the abstraction 22 has already been evaluated to determine if it complies where the various groundrules. Therefore, the invention allows a more simplified shape (e.g., the abstraction 22) to be used during the subsequent levels of the hierarchical design.

Figure 3A:
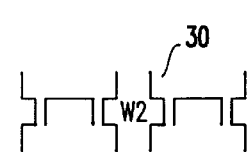
FIGS. 3A–3C are schematic diagrams of integrated circuit structures formed according to the invention.
Figure 3B:
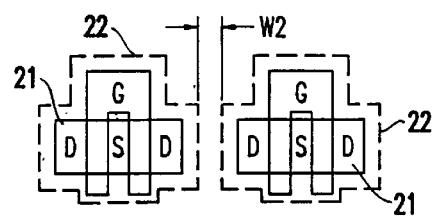
Figure 3C:
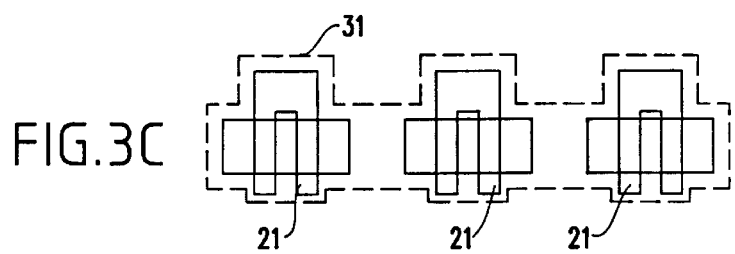

Next, the inter circuit device placement (e.g., device layout) is performed 12. The abstractions 21 are placed into groups of circuits, as shown in FIGS. 3A–3C. More specifically, the schematic drawing 30, shown in FIG. 3A, requires two transistors arranged side-by-side. Therefore, the invention places the abstractions 22 (which contain the shape 21) next to one another, as shown in FIG. 3B.

Thus, with the invention, instead of checking the distance between the individual shapes 21, the invention simplifies the process by only checking the distance between the abstractions W2 against the groundrules. For example, the space W2, which is the drain/drain spacing between two devices is checked and corrected (if needed). Again, although not shown in the drawings, as would be known by one ordinarily skilled in the art given this disclosure, proximity corrections in the form of serifs or subresolution elements could be introduced here to improve printability for the device-to-device features. This process is repeated until all device/device interactions are checked against the groundrules.

Once the lower level abstractions 22 are properly spaced, the next level of abstraction 31 is created around the previously positioned shapes 21, as shown in FIG. 3C. Once again, as discussed above, the devices/shapes 21 within the abstraction 31 will not be checked again against the groundrules during this process. Instead, the entire abstraction 31 will be referenced and positioned within the succeeding upper levels of the circuit design as an individual, non-divisible unit. By introducing proximity corrections at these early stages, the invention allows alterations in the placement of devices that would otherwise not occur.

Figure 4A:
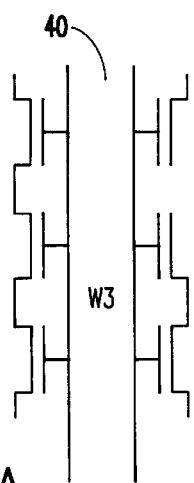
FIGS. 4A–4B are schematic diagrams of integrated circuit structures formed according to the invention.
Figure 4B:
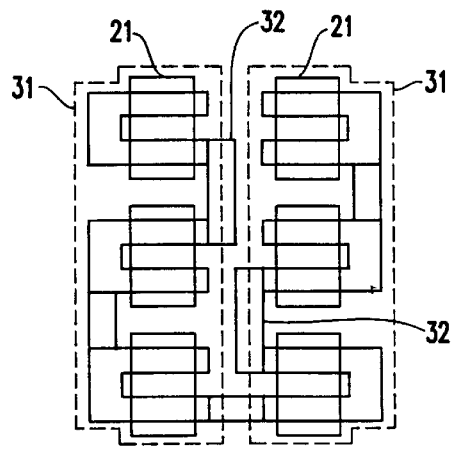

In item 13, the devices are arranged and the intra-circuit routing is performed in the next hierarchal level, for example, again utilizing the 5 μm grid requirement. Thus, as shown in FIG. 4A, the schematic diagram 40 requires parallel rows of adjacent transistors. Therefore, as shown in FIG. 4B the to abstractions 31 are arrange next to one another and various connections 32 are made between appropriate devices 21. As with the previous hierarchical levels, the spacing W3 between the abstractions 31 (which might be the dimension between word or bit lines) is checked to determine if it complies with the groundrules.

Once again, the spacing between individual devices 21 does not need to be checked and instead, only the spacing between the abstractions 31 is checked, which substantially simplifies the calculations (and CPU resources) required.

As mentioned above, a shapes correction algorithm 14 which compensates for predicted mask defects and other manufacturing effects can be utilized at any point in the invention. Therefore, for example, after the placement 12 and routing 13 of the individual devices, the shapes adjustment algorithms 14 can be performed. Alternatively, as would be known by one ordinarily skilled in the art given this disclosure, the shapes adjustment algorithms 14 can be performed at any point in the inventive process and the location of item 14 within the flowchart shown in FIG. 1 is merely exemplary.

Next, the inter-circuit placement of the circuits (e.g., circuit layout) is performed 15. As shown in FIG. 5A, the next hierarchical level abstractions 50 are formed around the structure shown in FIG. 4B. Additionally, the abstractions 50 are arranged in a grid pattern according to the next level of schematic design diagram (not illustrated). As discussed above, the spacings W4 and W5 are checked to see whether the array shown in FIG. 5A complies with to various groundrules.

Figure 5B:
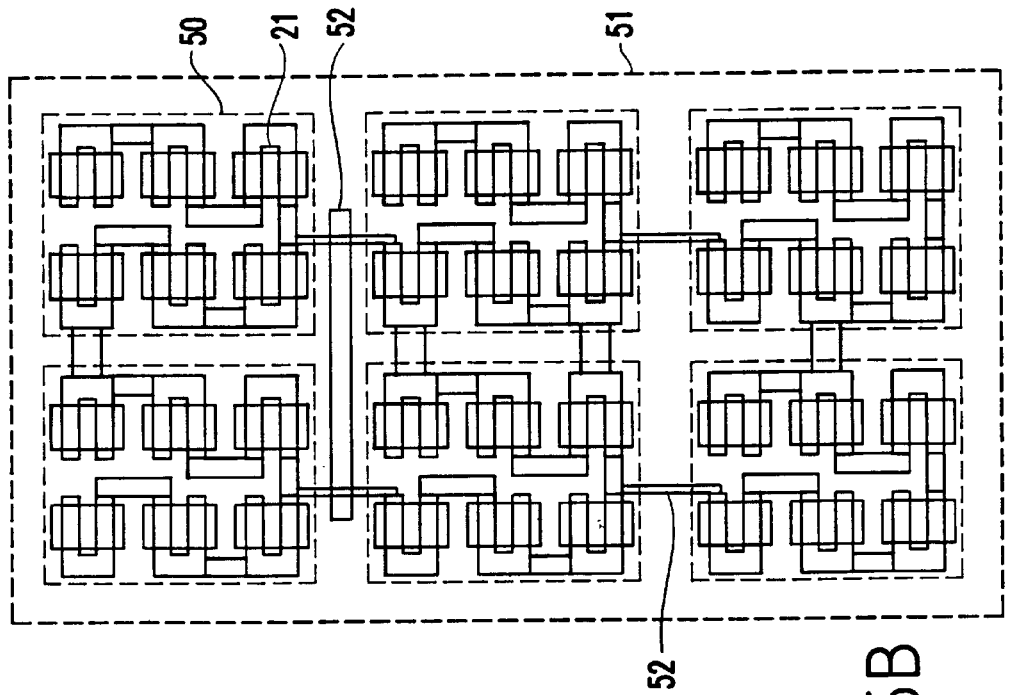
FIGS. 5A–5B are schematic diagrams of integrated circuit structures formed according to the invention.
Figure 5A:
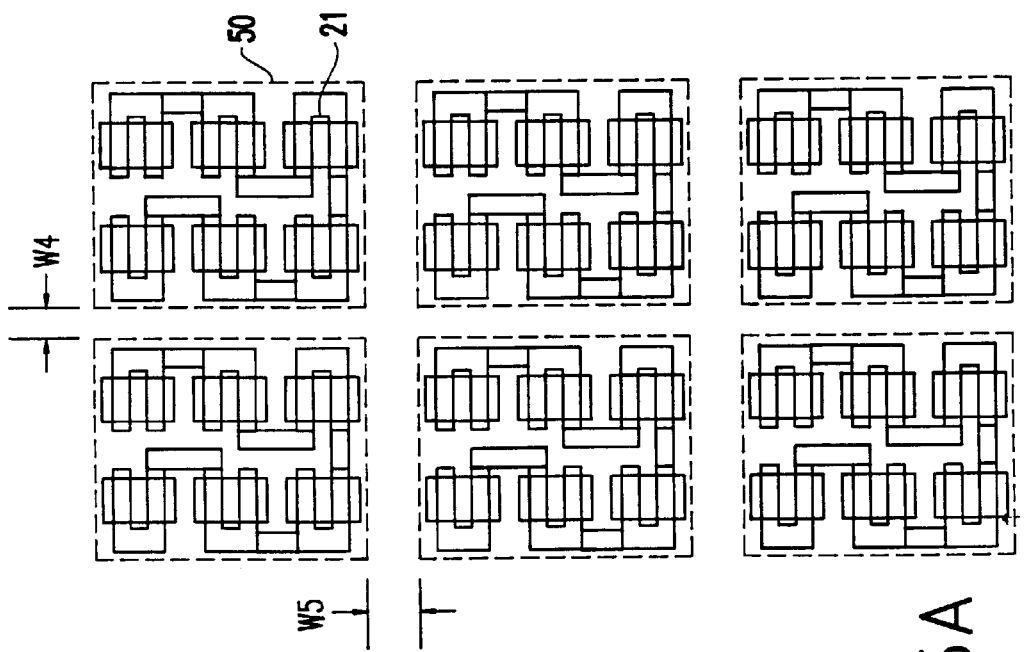

Then, the next hierarchal level inter circuit placement of the circuits (e.g., circuit layout) is performed 16, as also shown in FIG. 5B. More specifically, a larger abstraction 51 is formed around the grid shown in FIG. 5A. The various devices 21 are connected within the abstraction 51 by various connections 52.

Item 17 in FIG. 1 illustrates the process of checking the designed circuit against appropriate groundrules. This process can be performed at any point during the inventive cycle, such as after the formation of all abstraction's for a given hierarchal level of design. Item 17 is illustrated at one point in the flowchart in FIG. 1, however, as would be known by one ordinarily skilled in the art given this disclosure, its placement within the flowchart is merely exemplary and the processing represented by item 17 could occur at any point within the inventive cycle, depending upon the specific designers requirements.

In item 18, the shapes adjustment rules are repeated again, as described above with respect to item 14. There are many different algorithms which are useful for adjusting the designed shapes. In one exemplary algorithm, the shapes adjustment rules first apply a symmetric bias consistent with the mask build process to the shapes. Then the corners are replaced using empirically obtained beveling parameters. Then a reverse symmetric bias, which mimics the masking film etch bias, is applied. The resulting images closely approximate those found on actual masks. The images are then used as input to lithography modeling programs to predict the shapes of the wafer level images. Accounting for distortions introduced by the mask making process aids significantly in the improvement of the process window.

Additionally, there may be orientation dependent effects which may need to be included. The use of a double bevel adjustment of the shape design set or, bezier or cubic spline, parabolic or semicircular methodologies could be used with the shapes algorithm.

Finally, item 19 represents the mask data set output by the invention. As mentioned above, because of the increased flexibility afforded the designer and because of the reduced processing overhead requirements, the mask data set output by the invention is vastly superior to the output which would be seen from conventional systems and structures given the same input.

Figure 6:
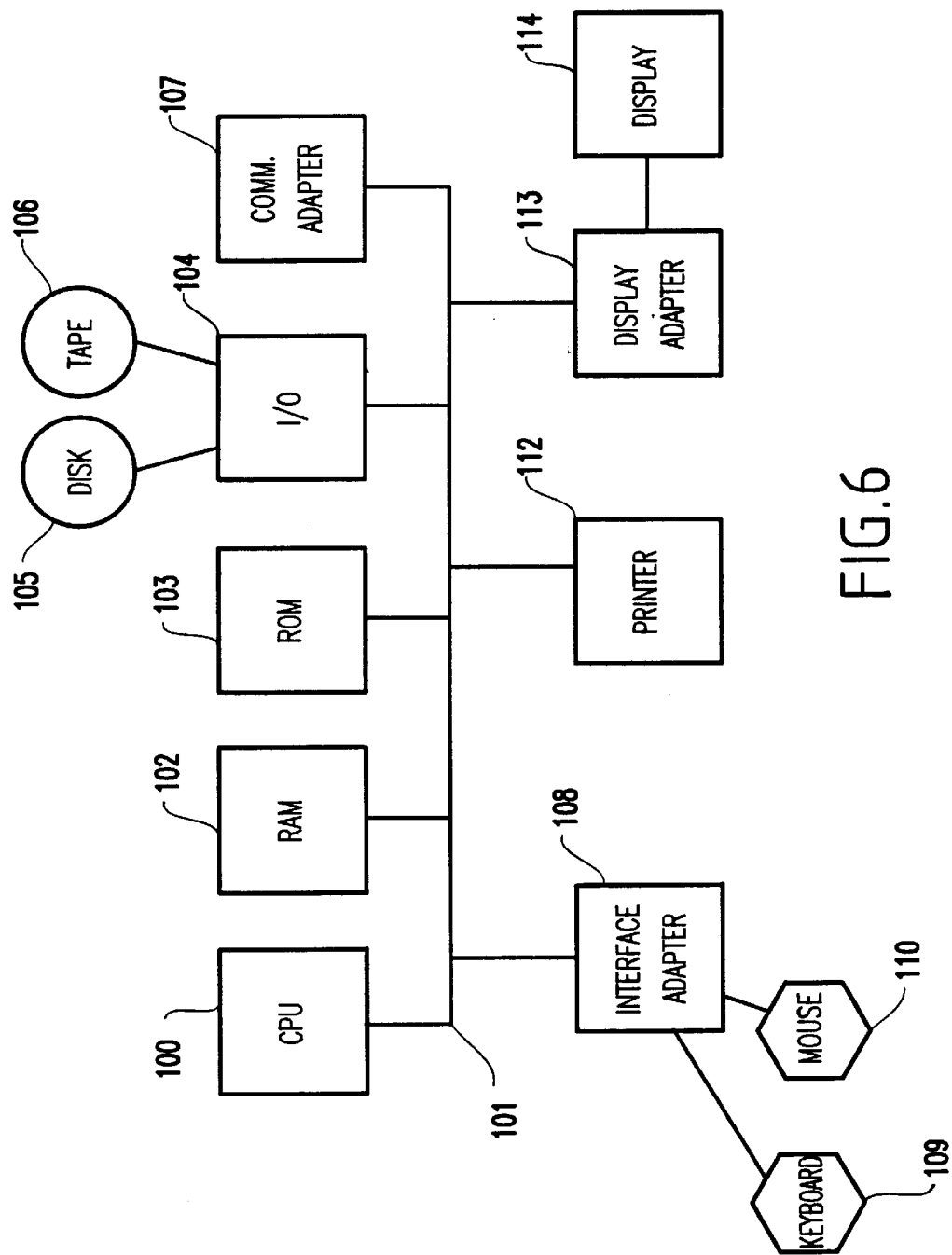
FIG. 6 is a hardware embodiment according to the invention.

While the overall methodology of the invention is described above, the invention can be embodied in any number of different types of systems and executed in any number of different ways, as would be known by one ordinarily skilled in the art. For example, as illustrated in FIG. 6, a typical hardware configuration of an information handling/computer system in accordance with the invention preferably has at least one processor or central processing unit (CPU) 100. The CPU 100 is interconnected via a system bus 101 to a random,access memory (RAM) 102, read-only memory (ROM) 103, input/output (I/O) adapter 104 (for connecting peripheral devices such as disk units 105 and tape drives 106 to the bus 101), communication adapter 107 (for connecting an information handling system to a data processing network) user interface adapter 108 (for connecting peripherals 109, 110 such as a keyboard, mouse, microphone speaker and/or other user interface device to the bus 101), a printer 112, and display adapter 113 (for connecting the bus 101 to a display device 114).

The invention could be implemented using the structure shown in FIG. 6 by including the inventive method within a computer program stored on the storage device 105. Such a computer program would act on information supplied through the interface units 109, 110 or through the network connection 107. The system would then automatically produce the final desired product on the display 114, through the printer 112 or back to the network 107.

As shown above, with the invention once the abstraction is formed around a device or group of devices within a circuit, the groundrules and other mask shaping systems do not need to check the individual relationships between the individual devices. Instead, with the invention the processes is dramatically simplified because the abstraction at each hierarchal level is treated as a single unit so that only the relationship between the different abstractions is checked against the groundrules. Thus, the invention simplifies the calculations required and reduces the overhead and processing capability required to perform such calculations.

Therefore, the invention allows the designer more flexibility during the design process by allowing shape modifications to occur at lower hierarchal levels working in the "bottom-up" processing system of the invention. Additionally, because the invention simplifies the processing involved, it also reduces the amount of CPU overhead required, which results in costs savings.

Benefits from the invention include reduced analysis time and reduced memory requirements of analysis. Further, the invention facilitates use of components which allows the analysis to amortized over many levels. Also, there is increased flexibility available for optional compensation and the design is kept in more manipulatable form.

While the invention has been described in terms of preferred embodiments, those skilled in the art will recognize that the invention can be practiced with modification within the spirit and scope of the appended claims.

Having thus described my invention, what we claim as new and desire to secure by letters patent is as follows:

1. A method of designing an integrated circuit comprising:
   generating at least one device shape;
   altering said device shape to comply with predetermined rules;
   forming a first hierarchical level abstraction around said device shape, said first hierarchical level abstraction representing a perimeter of said device shape;
   preparing a first hierarchical level arrangement of a plurality of first hierarchical level abstractions;
   altering said first hierarchical level arrangement to comply with said predetermined rules;
   forming a second hierarchical level abstraction around said first hierarchical level arrangement, said second hierarchical level abstraction representing a perimeter of said first hierarchical level arrangement;
   preparing a second hierarchical level arrangement of a plurality of second hierarchical level abstractions; and
   altering said second hierarchical level arrangement to comply with said predetermined rules.

2. The method in claim 1, wherein:
   said altering of said first hierarchical level includes comparing at least one of said first hierarchical abstractions with others of said first hierarchical abstractions within said first hierarchical level arrangement for consistency with said predetermined rules; and
   said altering of said second hierarchical level includes comparing at least one of said second hierarchical abstractions with others of said second hierarchical abstractions within said second hierarchical level arrangement for consistency with said predetermined rules.

3. The method in claim 1, further comprising, for each successive hierarchical level:
   forming a next hierarchical level abstraction around a previous hierarchical level arrangement, said next hierarchical level abstraction representing a perimeter of said previous hierarchical level arrangement;
   preparing a next hierarchical level arrangement of a plurality of next hierarchical level abstractions; and
   altering said next hierarchical level arrangement to comply with said predetermined rules.

4. The method in claim 1, wherein said predetermined rules include at least one of spacing requirements, uniform element formation requirements, uniform material thickness requirements, width, alignment, step, coverage, and minimum necking.

5. The method in claim 1, wherein said altering of said device shape includes making shape corrections to nullify anticipated manufacturing effects.

6. A method of designing an integrated circuit comprising:
   preparing a second hierarchical level arrangement of a plurality of first hierarchical level abstractions, said first hierarchical level abstractions each corresponding to a perimeter of a previous first hierarchical level;
   altering said second hierarchical level arrangement to comply with predetermined rules; and
   forming a next hierarchical level abstraction around said second hierarchical level arrangement, said next hierarchical level abstraction representing a perimeter of said second hierarchical level arrangement.

7. The method in claim 6, wherein said altering of said second hierarchical level includes comparing at least one of said first hierarchical abstractions with others of said first hierarchical abstractions within said second hierarchical level arrangement for consistency with said predetermined rules.

8. The method in claim 6, further comprising, for each successive hierarchical level repeating said preparing, altering and forming.

9. The method in claim 6, wherein said predetermined rules include at least one of spacing requirements, uniform element formation requirements, uniform material thickness requirements, width, alignment, step, coverage, and minimum necking.

10. The method in claim 6, wherein said altering includes making shape corrections to nullify anticipated manufacturing effects.

11. A program storage device readable by machine, tangibly embodying a program of instructions executable by the machine to perform a method for designing an integrated circuit, said method comprising:
   generating at least one device shape;
   altering said device shape to comply with predetermined rules;
   forming a first hierarchical level abstraction around said device shape, said first hierarchical level abstraction representing a perimeter of said device shape;
   preparing a first hierarchical level arrangement of a plurality of first hierarchical level abstractions;
   altering said first hierarchical level arrangement to comply with said predetermined rules;
   forming a second hierarchical level abstraction around said first hierarchical level arrangement, said second hierarchical level abstraction representing a perimeter of said first hierarchical level arrangement;
   preparing a second hierarchical level arrangement of a plurality of: second hierarchical level abstractions; and
   altering said second hierarchical level arrangement to comply with said predetermined rules.

12. The program storage device in claim 11, wherein:
   said altering of said first hierarchical level includes comparing at least one of said first hierarchical abstractions with others of said first hierarchical abstractions within said first hierarchical level arrangement for consistency with said predetermined rules; and
   said altering of said second hierarchical level includes comparing at least one of said second hierarchical abstractions with others of said second hierarchical abstractions within said second hierarchical level arrangement for consistency with said predetermined rules.

13. The program storage device in claim 11, wherein said method further comprises, for each successive hierarchical level:

forming a next hierarchical level abstraction around a previous hierarchical level arrangement, said next hierarchical level abstraction representing a perimeter of said previous hierarchical level arrangement;

preparing a next hierarchical level arrangement of a plurality of next hierarchical level abstractions; and altering said next hierarchical level arrangement to comply with said predetermined rules.

14. The program storage device in claim 11, wherein said predetermined rules include at least one of spacing requirements, uniform element formation requirements, uniform material thickness requirements, width, alignment, step, coverage, and minimum necking.

15. The program storage device in claim 11, wherein said altering of said device shape includes making shape corrections to nullify anticipated manufacturing effects.

16. A computer system comprising at least one central processing unit, at least one input device, at least one output device and at least one storage device, said storage device tangibly embodying a program of instructions executable by the central processing unit to perform a method for designing an integrated circuit, said method comprising:

generating at least one device shape;

altering said device shape to comply with predetermined rules;

forming a first hierarchical level abstraction around said device shape, said first hierarchical level abstraction representing a perimeter of said device shape;

preparing a first hierarchical level arrangement of a plurality of first hierarchical level abstractions;

altering said first hierarchical level arrangement to comply with said predetermined rules;

forming a second hierarchical level abstraction around said first hierarchical level arrangement, said second hierarchical level abstraction representing a perimeter of said first hierarchical level arrangement;

preparing a second hierarchical level arrangement of a plurality of second hierarchical level abstractions; and altering said second hierarchical level arrangement to comply with said predetermined rules.

17. The computer system in claim 16, wherein:

said altering of said first hierarchical level includes comparing at least one of said first hierarchical abstractions with others of said first hierarchical abstractions within said first hierarchical level arrangement for consistency with said predetermined rules; and said altering of said second hierarchical level includes comparing at least one of said second hierarchical abstractions with others of said second hierarchical abstractions within said second hierarchical level arrangement for consistency with said predetermined rules.

18. The computer system in claim 16, wherein said method further comprises, for each successive hierarchical level:

forming a next hierarchical level abstraction around a previous hierarchical level arrangement, said next hierarchical level abstraction representing a perimeter of said previous hierarchical level arrangement;

preparing a next hierarchical level arrangement of a plurality of next hierarchical level abstractions; and altering said next hierarchical level arrangement to comply with said predetermined rules.

19. The computer system in claim 16, wherein said predetermined rules include at least one of spacing requirements, uniform element formation requirements, uniform material thickness requirements, width, alignment, step, coverage, and minimum necking.

20. The computer system in claim 16, wherein said altering of said device shape includes making shape corrections to nullify anticipated manufacturing effects.

* * * * *